United States Patent
Kang et al.

(10) Patent No.: US 7,348,772 B2
(45) Date of Patent: *Mar. 25, 2008

(54) PRINTED CIRCUIT BOARD HAVING WEAK MAGNETIC FIELD SENSOR AND METHOD OF MANUFACTURING THE SAME

(75) Inventors: Myung-Sam Kang, Daejeon (KR); Chang-Sup Ryu, Daejeon (KR); Won-Cheol Bae, Kyunggi-Do (KR); Sang-Duck Kim, Daegu (KR); Doo-Hwan Lee, Chungcheongbuk-do (KR)

(73) Assignee: Samsung Electro-Mechanics Co., Ltd, Kyunggi-Do (KR)

( * ) Notice: Subject to any disclaimer, the term of this patent is extended or adjusted under 35 U.S.C. 154(b) by 34 days.

This patent is subject to a terminal disclaimer.

(21) Appl. No.: 10/975,736

(22) Filed: Oct. 28, 2004

(65) Prior Publication Data

US 2006/0017435 A1 Jan. 26, 2006

(30) Foreign Application Priority Data

Jul. 24, 2004 (KR) ...................... 10-2004-0058050

(51) Int. Cl.
*G01R 33/04* (2006.01)
(52) U.S. Cl. .................. 324/253; 324/249; 324/260
(58) Field of Classification Search ............... 324/253, 324/244–260, 234; 336/200, 232; 438/3, 438/48
See application file for complete search history.

(56) References Cited

U.S. PATENT DOCUMENTS

| 5,936,403 | A | 8/1999 | Tamura |
| 6,270,686 | B1 | 8/2001 | Tamura |
| 6,753,682 | B2 * | 6/2004 | Kang et al. ................. 324/253 |
| 2006/0001422 | A1 * | 1/2006 | Kang et al. ................. 324/260 |

FOREIGN PATENT DOCUMENTS

| KR | 2000-07791 | 2/2000 |
| KR | 2003-73286 | 9/2003 |
| KR | 2004-11287 | 2/2004 |

* cited by examiner

*Primary Examiner*—Reena Aurora
(74) *Attorney, Agent, or Firm*—Gottlieb, Rackman & Reisman, P.C

(57) ABSTRACT

A Printed Circuit Board (PCB) having a weak magnetic field sensor of the present invention includes a base plate on which a first excitation circuit and a first detection circuit are formed on each of the sides thereof, soft magnetic core bodies laminated on the top and bottom of the base plate, respectively, and formed of a plurality of soft magnetic cores, and outer layers that are laminated on the soft magnetic core bodies, respectively, and on which a second excitation circuit and a second detection circuit connected to the first excitation circuit and the first detection circuit through via holes are formed so as to surround the soft magnetic cores, respectively. The present invention is characterized in that the soft magnetic cores, the excitation circuit and the detection circuit formed on one side of the base plate are perpendicular to the soft magnetic cores, the excitation circuit and the detection circuit formed on the other side of the base plate.

5 Claims, 10 Drawing Sheets

PRINTED CIRCUIT BOARD HAVING WEAK MAGNETIC FIELD SENSOR AND METHOD OF MANUFACTURING THE SAME

BACKGROUND OF THE INVENTION

1. Field of the Invention

The present invention relates generally to a printed circuit board having a weak magnetic field sensor and a method of manufacturing the same and, more particularly, to a printed circuit board having a weak magnetic field sensor, in which a soft magnetic core excitation circuit and a detection circuit are formed on the top and bottom of the printed circuit board to be perpendicular to each other, so that a weak magnetic field in a range similar to that of the geomagnetic field can be detected, and a method of manufacturing the same.

2. Description of the Related Art

Recently, weak magnetic field sensors are used in many applications, such as a navigation system depending on geomagnetism detection, a geomagnetism variation monitor for the prediction of earthquakes, some biomagnetism measurement, defect detection for metallic materials, magnetic encoding, a non-contact type potential meter, a current sensor, a torque sensor and a displacement sensor.

In particular, in order to provide a location information service for mobile phones and mobile terminals, sensors capable of accurately detecting current locations are required, and the weak magnetic field sensors for detecting the geomagnetic field and detecting current locations, shown in FIG. 1, are used as means for providing such location information.

FIG. 1 is a view showing the schematic construction of a conventional weak magnetic field sensor. FIG. 2a is a timing diagram of a magnetic field generated in a first magnetic core, and FIG. 2b is a timing diagram of a magnetic field generated in a second magnetic core. FIG. 2c is a timing diagram of a magnetic flux density generated in the first magnetic core, and FIG. 2d is a timing diagram of a magnetic flux density generated in the second magnetic core. FIG. 2e is a timing diagram showing a first induced voltage Vind1 and a second induced voltage Vind2 induced to a detection coil, and FIG. 2f is a timing diagram showing the sum of the first and second induced voltages Vind1+Vind2.

As shown in FIG. 1, the conventional weak magnetic field sensor includes first and second large rod-shaped magnetic cores 1a and 1b, excitation coils 2a and 2b wound around the first and second magnetic cores 1a and 1b, respectively, at regular intervals in regular directions so as to produce magnetic fields, and detection coils 3a and 3b wound to surround the first and second magnetic cores 1a and 1b at regular intervals in regular directions so as to detect the magnetic fields generated in the first and second magnetic cores.

The operation of the conventional weak magnetic field sensor is described with reference to FIGS. 2a to 2f. The internal magnetic field H1 of the first magnetic core 1a attributable to an Alternating Current (AC) excitation current is represented by 'Hext (external magnetic field)+Hexc (magnetic field attributable to excitation coils),' while the internal magnetic field H2 of the second magnetic core 1b is represented by 'Hext−Hexc.'

Additionally, the magnetic flux density B1 of the first magnetic core 1a is represented by 'Bext (magnetic flux density attributable to external magnetic field)+Bexc (magnetic flux densities attributable to excitation coils),' while the magnetic flux density B2 of the second magnetic core 1b is represented by 'Bext−Bexc.'

That is, the internal magnetic fields H1 and H2 and the magnetic flux densities B1 and B2 represented through the first and second magnetic cores 1a and 1b are generated in opposite directions.

In this case, the first and second induced voltages Vind1 and Vind2, which are generated by the first and second magnetic cores 1a and 1b and detected by the detection coils 3a and 3b, are represented as shown in FIG. 2e.

In this case, since the detection coils 3a and 3b are wound to take the sum of flux changes generated in the first and second magnetic cores 1a and 1b, the voltage measured by the detection coils 3a and 3b is detected as shown in FIG. 2f because the first and second induced voltages Vind1 and Vind2 cancel out.

That is, the magnetic fields, which are attributable to the excitation coils 2a and 2b and are applied in the axial directions of the first and second magnetic cores 1a and 1b, are applied in opposite directions, so that the magnetic fields Hexc cancel out and are zero. However, the external magnetic fields Hext, which are applied in the axial directions of the first and second magnetic cores 1a and 1b, are applied in the same direction with respect to the first and second magnetic cores 1a and 1b, so that the external magnetic fields Hext do not cancel out.

Accordingly, the amount of the external magnetic fields Hext can be evaluated by measuring the amount of the sum of the first and second induced voltages Vind1 and Vind2.

However, the conventional weak magnetic field sensor has difficulty in maintaining location precision when the excitation coils 2a and 2b and the detection coils 3a and 3b are wound around the magnetic cores 1a and 1b, and further has a problem in that the precision of characteristic values is reduced because the conventional weak magnetic field sensor is easily affected by temperature, light and surface material.

Furthermore, since the excitation coils 2a and 2b and the detection coils 3a and 3b are wound directly around the magnetic cores 1a and 1b, the conventional weak magnetic field sensor is problematic in that the coils are frequently cut.

Furthermore, since the conventional weak magnetic field sensor has a large size and the power consumption thereof is high, the conventional weak magnetic field sensor is problematic in that it is not suitable for tendencies toward the miniaturization and lightweight of electronic products.

In order to overcome such problems of the conventional weak magnetic field sensor, U.S. Pat. Nos. 5,936,403 and 6,270,686 disclose weak magnetic field sensors, which are manufactured in such a way that an amorphous core is produced by laminating annularly etched amorphous plates on both sides of an epoxy substrate in which patterns are etched so that the top and bottom thereof are conducted to each other, and epoxy substrates on which X-coils and Y-coils are etched are laminated on the top and bottom of the amorphous core.

However, the inventions disclosed in U.S. Pat. Nos. 5,936,403 and 6,270,686 are problematic in that the amorphous core must be manufactured by laminating the annularly etched amorphous plates on the epoxy substrate with the patterns being aligned with the etched parts, and the epoxy substrates on which X-coils and Y-coils are etched must be laminated on the top and bottom of the amorphous core, so that a manufacturing process is complicated, the number of the layers of a circuit board are increasing and high costs are incurred.

Furthermore, the inventions disclosed in U.S. Pat. Nos. 5,936,403 and 6,270,686 are problematic in that the lands of coils are concentrated on the inside of the annular amorphous core, so that the turns of coils are limited. Accordingly, the density of the coils per unit length is low, so that the sensitivity of detection of a weak magnetic field is reduced and a tendency toward the miniaturization of electronic products is not accommodated.

In order to solve the above-described problems, Korean Pat. No. 432,662 filed on Mar. 9, 2002 by the present applicant discloses a weak magnetic field sensor using Printed Circuit Board (PCB) technology. This weak magnetic field sensor includes a first substrate on which first driving patterns and first pickup patterns are formed on both sides thereof, first layer bodies that are laminated on both sides of the first substrate and on which magnetic substances patterned in predetermined forms are formed, and second layer bodies that are laminated on the first layer bodies and in which second driving patterns and second pickup patterns are connected to the first driving patterns and the first pickup patterns, respectively. The magnetic substance, the driving patterns and the pickup patterns formed on the top of the first substrate, and the magnetic substance, the driving patterns and the pickup patterns formed on the bottom of the first substrate are perpendicular to each other.

However, the invention disclosed in Korea Pat. No. 432,662 has a problem in that it is difficult to provide a subminiature weak magnetic sensor to be mounted on a PCB according to demands for miniaturized, highly integrated and multi-functional electronic products.

SUMMARY OF THE INVENTION

Accordingly, the present invention has been made keeping in mind the above problems occurring in the prior art, and an object of the present invention is to provide a PCB having a high-sensitive weak magnetic field sensor for precisely detecting a weak magnetic field, such as the geomagnetic field, and a method of manufacturing the same.

Another object of the present invention is to provide a PCB having a subminiature weak magnetic field sensor that is required by miniaturized, lightweight, highly integrated and multi-functional electronic products, and a method of manufacturing the same.

In order to accomplish the above object, the present invention provides a PCB having a weak magnetic field sensor, including a base plate on which a first excitation circuit and a first detection circuit are formed on each of the sides thereof, soft magnetic core bodies that are laminated on a top and a bottom of the base plate, respectively, and formed of a plurality of soft magnetic cores, and outer layers that are laminated on the soft magnetic core bodies, respectively, and on which a second excitation circuit and a second detection circuit connected to the first excitation circuit and the first detection circuit through via holes are formed so as to surround the soft magnetic cores, respectively. The soft magnetic cores, the excitation circuit and the detection circuit formed on a first side of the base plate may be perpendicular to the soft magnetic cores, the excitation circuit and the detection circuit formed on a second side of the base plate, respectively.

The plurality of soft magnetic cores may form rods whose number is a multiple of two, and the excitation circuits and the detection circuits may be perpendicular to the plurality of soft magnetic cores.

The plurality of soft magnetic cores may have rectangular ring shapes, the excitation circuit and the detection circuit formed on the first side of the base plate may be perpendicular to sides of the soft magnetic cores, and the excitation and detection circuits formed on the second side of the base plate may be parallel with the sides of the soft magnetic cores.

In order to accomplish the above object, the present invention provides a method of manufacturing a PCB having a weak magnetic field sensor, including the steps of (A) providing a base plate on which a first x-axial excitation circuit and a first x-axial detection circuit are formed on the first side thereof and on which a first y-axial excitation circuit and a first y-axial detection circuit are formed on the second side thereof, and providing x-axial and y-axial soft magnetic core bodies in which x-axial and y-axial soft magnetic cores are formed in a multi-layered structure, (B) sequentially laminating an insulator, the x-axial soft magnetic core bodies, an insulator and a copper foil on the first side of the base plate, and sequentially laminating an insulator, the y-axial soft magnetic core bodies, an insulator and a copper foil on the second side of the base plate, and (C) forming second x-axial and y-axial excitation circuits and detection circuits, which are conducted to the first x-axial and y-axial excitation circuits and detection circuits, respectively, on the copper foils so as to be wound around the x-axial and y-axial soft magnetic cores.

The step (A) may include the steps of (A-1) forming the first x-axial excitation circuit and the first x-axial detection circuit on the first side of the base plate, and forming the first y-axial excitation circuit and the first y-axial first detection circuit on the second side of the base plate, (A-2) laminating preforms of the soft magnetic cores on both sides of the two insulators, (A-3) applying etching resists to surfaces of the preforms of the four soft magnetic cores of the two insulators, and forming certain etching resist patterns by exposing and developing the etching resists, (A-4) etching the preforms of the soft magnetic cores using the etching resist patterns, forming the x-axial soft magnetic core bodies by forming x-axial soft magnetic cores on the preforms of the two soft magnetic cores laminated on a first insulator, and forming the y-axial soft magnetic core bodies by forming y-axial soft magnetic cores on the preforms of the two soft magnetic cores laminated on a second insulator, and (A-5) removing the etching resists.

The step (A) may further include the steps of (A-6) laminating the insulators and the preforms of the soft magnetic cores on first sides of the x-axial and y-axial soft magnetic core bodies, (A-7) applying the etching resists to surfaces of the preforms of the soft magnetic cores of step (A-6), and forming certain etching resist patterns by exposing and developing the etching resists, (A-8) forming an x-axial soft magnetic core on the preform of the soft magnetic core laminated on the x-axial soft magnetic core bodies and forming a y-axial soft magnetic core on the preform of the soft magnetic core laminated on the y-axial soft magnetic core bodies, by etching the preforms of the soft magnetic cores using the etching resist patterns of step (A-7), (A-9) removing the etching resists of step (A-8), and (A-10) forming a desired number of x-axial and y-axial soft magnetic cores by repeating steps (A-6) to (A-9).

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
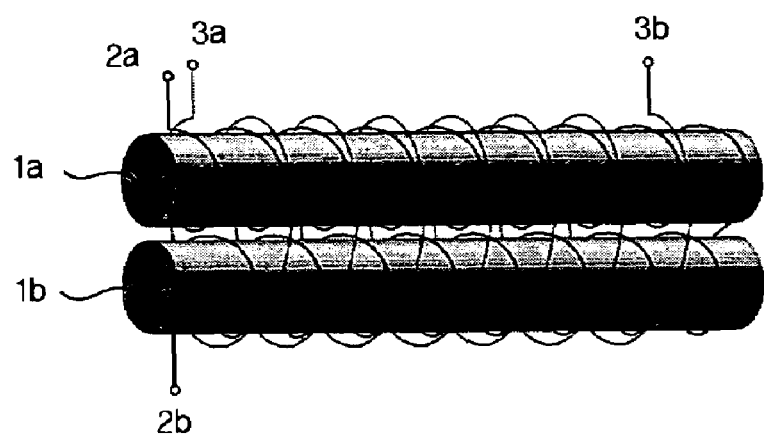
FIG. 1 is a view showing the schematic construction of a conventional weak magnetic field sensor.
Figure 2A:
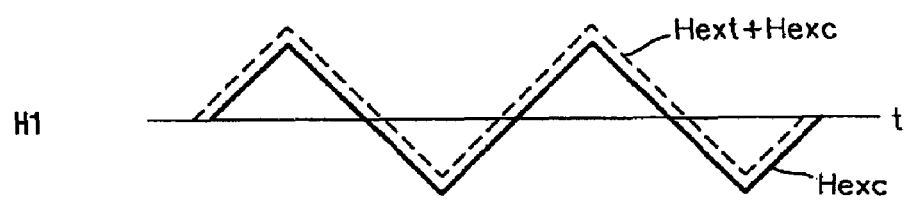
FIGS. 2a to 2f are timing diagrams illustrating the operation of the weak magnetic field sensor of FIG. 1.
Figure 2B:
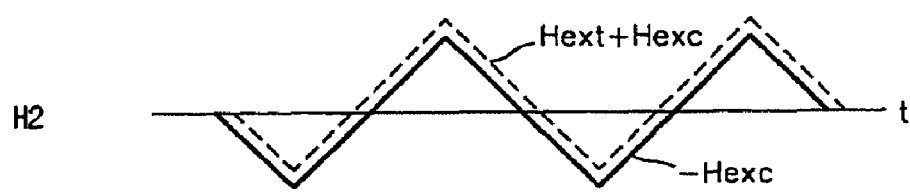
Figure 2C:
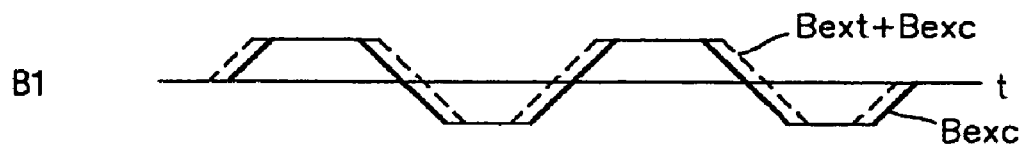
Figure 2D:
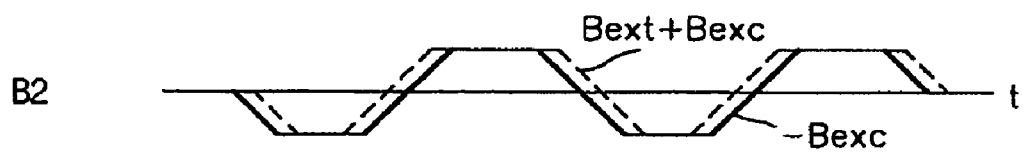
Figure 2E:
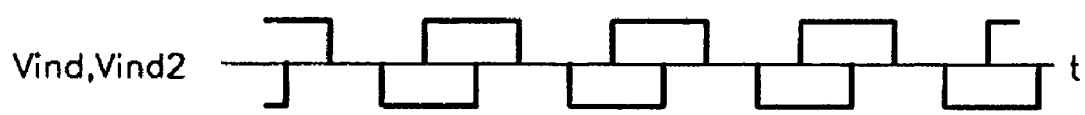
Figure 2F:

Reference now should be made to the drawings, in which the same reference numerals are used throughout the different drawings to designate the same or similar components.

A PCB having a weak magnetic field sensor and a method of manufacturing the same are described in detail with reference to the attached drawings below.

Figure 3:
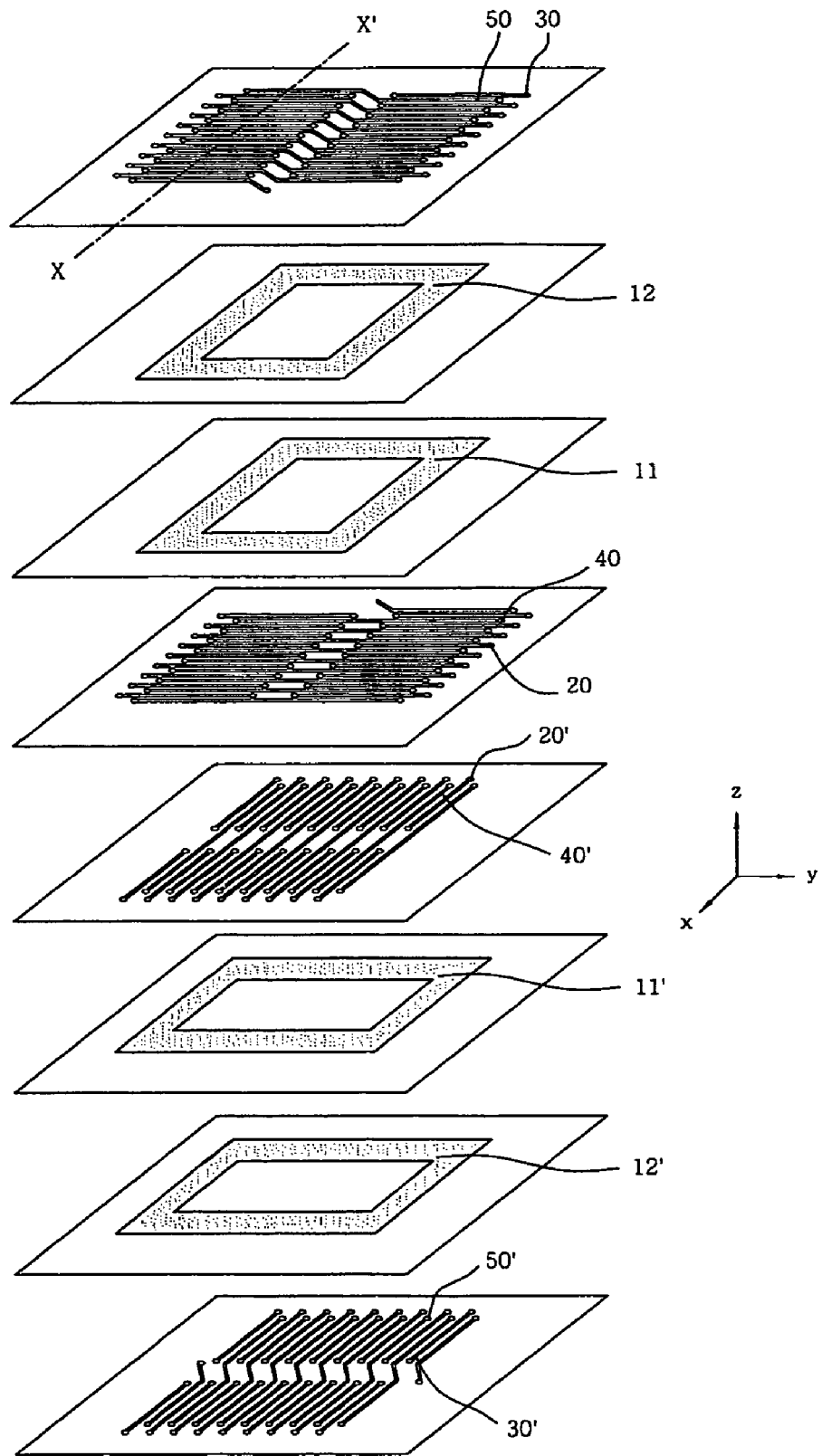
FIG. 3 is an exploded perspective view showing a PCB having a weak magnetic field sensor according to an embodiment of the present invention.

FIG. 3 is an exploded perspective view showing the PCB having the weak magnetic field sensor according to an embodiment of the present invention.

As shown in FIG. 3, the PCB having the weak magnetic field sensor according to the present invention, sequentially from the top thereof, includes a first layer on which a second x-axial excitation circuit 30 and a second x-axial detection circuit 50 are formed, a second layer on which a second x-axial soft magnetic core 12 is formed, a third layer on which a first x-axial soft magnetic core 11 is formed, a fourth layer on which a first x-axial excitation circuit 20 and a first x-axial detection circuit 40 are formed, a fifth layer on which a first y-axial excitation circuit 20' and a first y-axial detection circuit 40' are formed, a sixth layer on which a first y-axial soft magnetic core 11' is formed, a seventh layer on which a second y-axial soft magnetic core 12' is formed, and an eighth layer on which a second y-axial excitation circuit 30' and a second y-axial detection circuit 50' are formed.

In this case, the first to fourth layers are constructed to detect an x-axial weak magnetic field, and the fifth to eighth layers are constructed to detect a weak magnetic field in a direction perpendicular to the x-axis (i.e., y-axis). Accordingly, the PCB having the weak magnetic field sensor has a structure in which a sensor for detecting the x-axial weak magnetic field and a sensor for detecting the y-axial weak magnetic field are overlapped and combined together.

Accordingly, the PCB having the weak magnetic field sensor of the present invention can measure x-axial and y-axial weak magnetic fields (e.g., geomagnetic fields) at the same time.

The x-axial weak magnetic field sensor is described below. The first x-axial excitation and detection circuits 30 and 50, and the second x-axial excitation and detection circuits 20 and 40 are formed on both sides of an x-axial soft magnetic core pair 11 and 12, with the x-axial soft magnetic core pair 11 and 12 being interposed therebetween.

In this case, the linear patterns of the second x-axial excitation circuit 30 and the linear patterns of the second x-axial detection circuit 50 are alternately formed at regular intervals on the same plane. The second x-axial excitation circuit 30 is formed in the x-axis direction to form two separated columns. In contrast, the second x-axial detection circuit 50 is formed in the x-axis direction to form a single column, and formed in such a way that each of one side detection circuit patterns is connected to a corresponding one of the other side detection circuit patterns in a single direction.

Similarly, the linear patterns of the first x-axial excitation circuit 20 and the linear patterns of the first x-axial detection circuit 40 are alternately formed at regular intervals on the same plane. The first x-axial excitation circuit 20 is formed in an x-axis direction to form two separated columns. In contrast, the first x-axial detection circuit 40 is formed in an x-axis direction to form a single column, and formed in such a way that each of one side detection circuit patterns is connected to a corresponding one of the other side detection circuit patterns.

In this case, the first and second x-axial detection circuits 40 and 50, and the first and second x-axial excitation circuits 20 and 30 can be formed to alternate a predetermined number of times, but they preferably alternate two times.

The x-axial weak magnetic field sensor according to the present invention has via holes (not shown) to electrically connect the first and second x-axial excitation circuits 20 and 30. Similarly, the x-axial weak magnetic field sensor has via holes (not shown) to electrically connect the first and second x-axial detection circuits 40 and 50.

The above-described first and second x-axial excitation circuits 20 and 30 are connected to each other in zigzag through the via holes, and form a single line.

Similarly, the first and second x-axial detection circuits 40 and 50 are connected to each other in zigzag through the via holes, and form a single line. However, the first and second x-axial detection circuits 40 and 50 are formed in such a way that they are wound around all the x-axial soft magnetic core pair 11 and 12 so that a cross section taken along a yz-plane forms a "0" shape.

In an embodiment, the first and second x-axial soft magnetic cores 11 and 12 of the weak magnetic field sensor according to the present invention may be formed in a rectangular ring shape or a similar shape. The first and second x-axial soft magnetic cores 11 and 12 are preferably made of material selected from the group consisting of amorphous metal, permalloy and supermalloy.

Thereafter, the y-axial weak magnetic field sensor according to the present invention has the same detailed construction and manufacturing process as the x-axial weak magnetic field sensor, except that the y-axial weak magnetic field sensor is constructed to be perpendicular to the above-described x-axial weak magnetic field sensor.

In the PCB having the weak magnetic field sensor constructed as described above according to the present invention, the magnetic flux densities of the soft magnetic cores 11, 12, 11' and 12' vary when an AC current flows through the excitation circuits 20, 30, 20' and 30'. Accordingly, currents are induced to the detection circuits 40, 50, 40' and 50' and cause a voltage difference. By detecting such a voltage difference, x-axial and y-axial magnetic fields are detected.

Figure 4A:
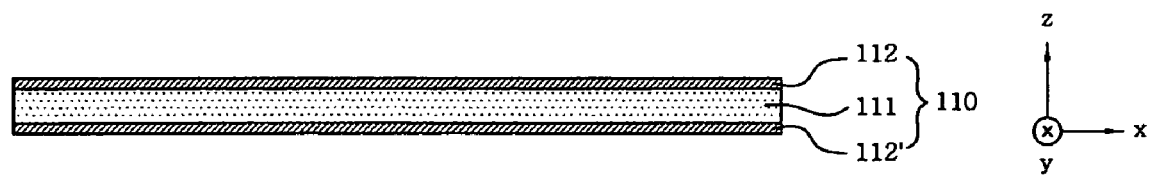
FIGS. 4a to 4q are cross sections taken along line X-X' of FIG. 3, which show the flow of a method of manufacturing the PCB having the weak magnetic field sensor.
Figure 4B:
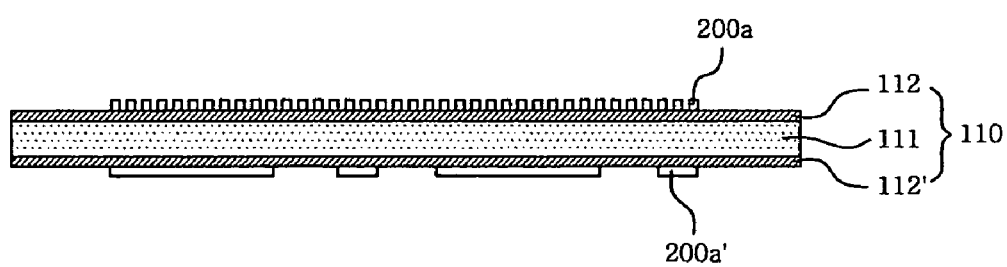
Figure 4C:
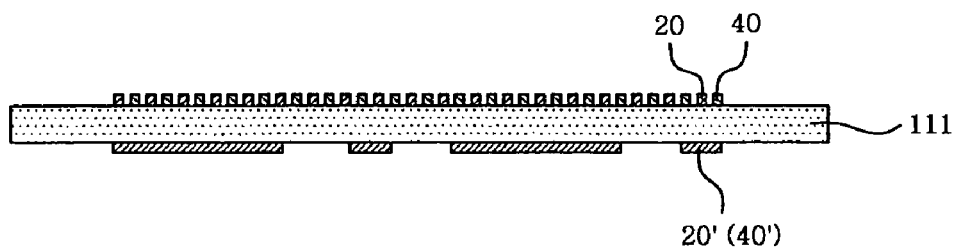
Figure 4D:
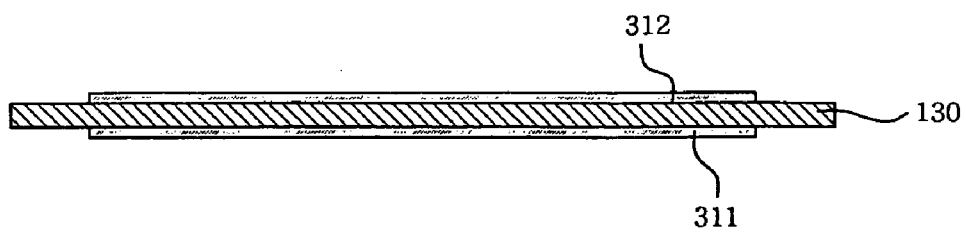
Figure 4E:
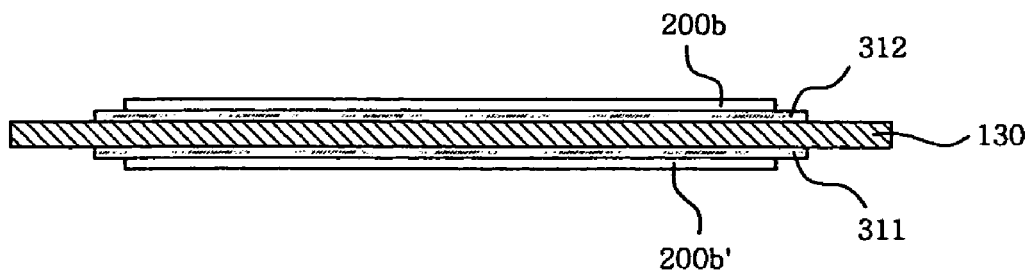
Figure 4F:
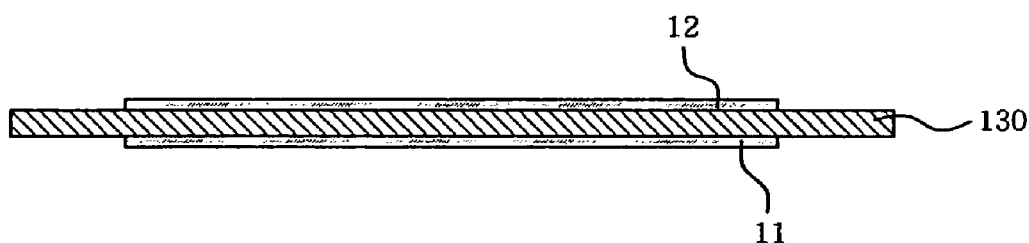
Figure 4G:
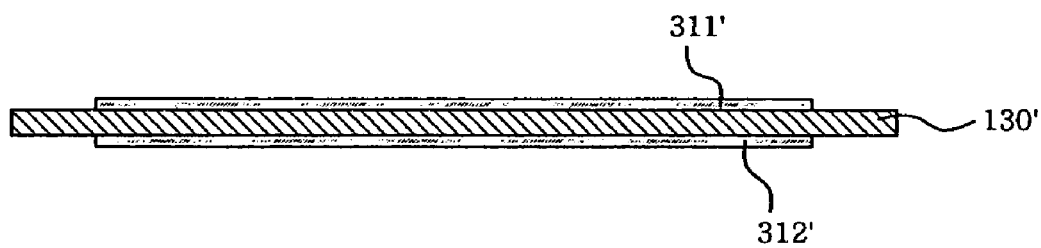
Figure 4H:
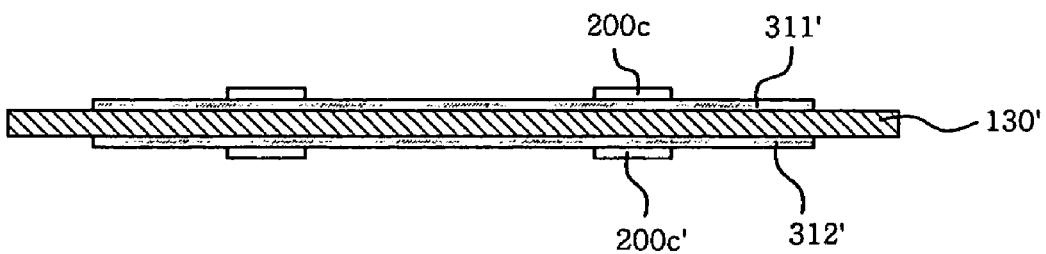
Figure 4I:
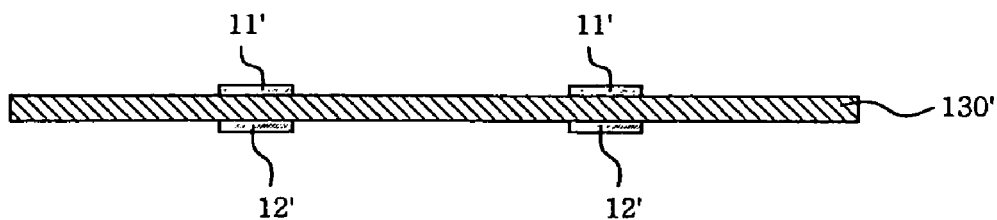
Figure 4J:
Figure 4J:
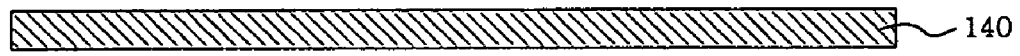
Figure 4J:
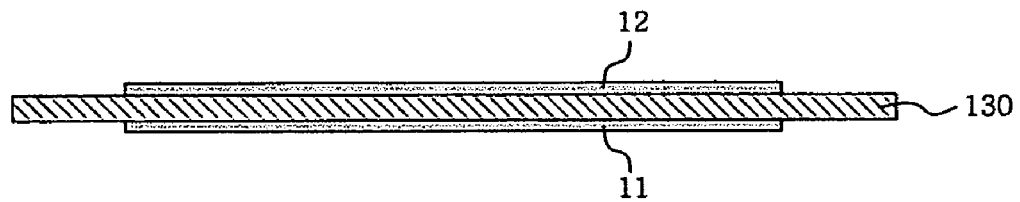
Figure 4J:
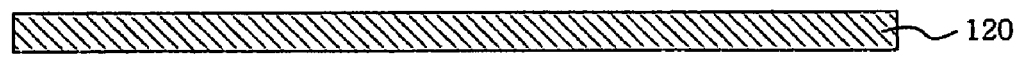
Figure 4J:
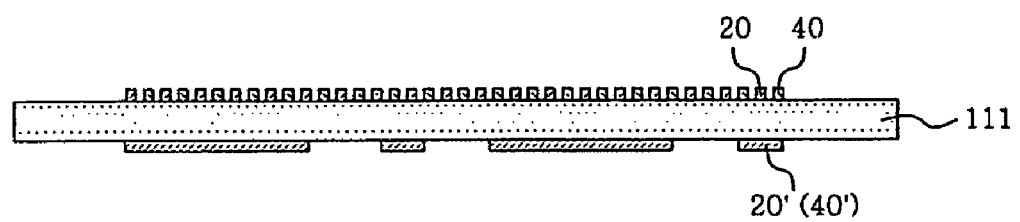
Figure 4J:
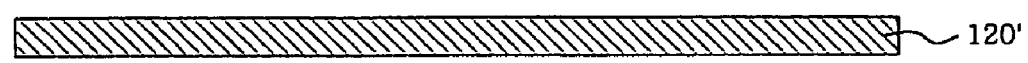
Figure 4J:
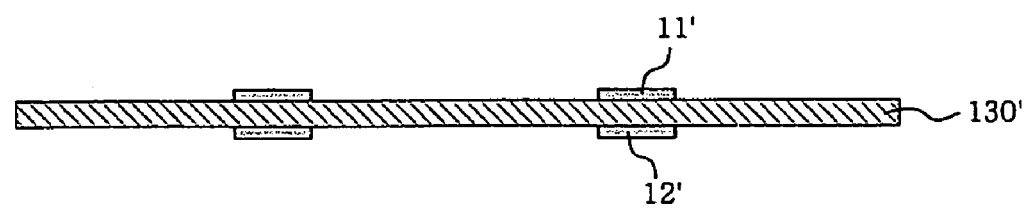
Figure 4J:
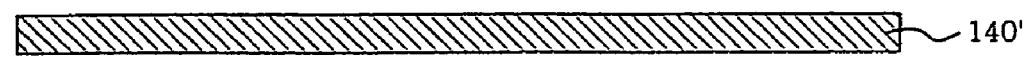
Figure 4J:
Figure 4K:
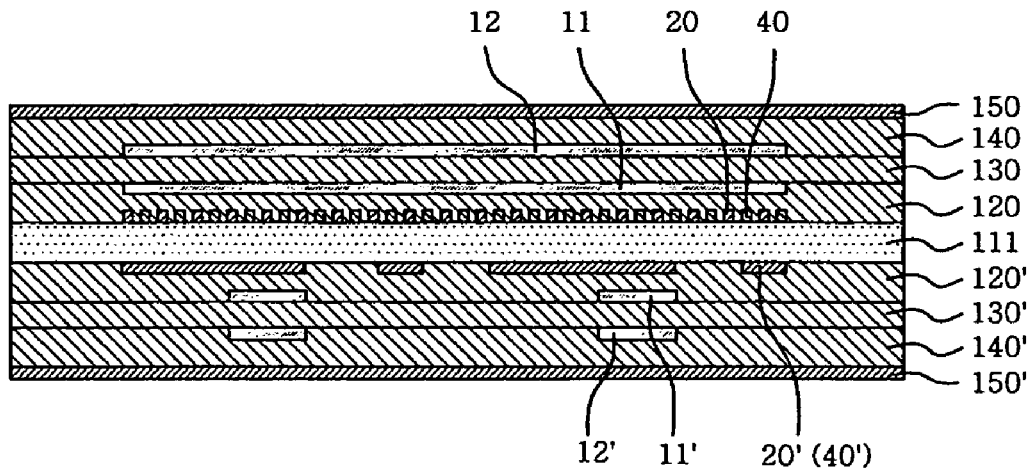
Figure 4L:
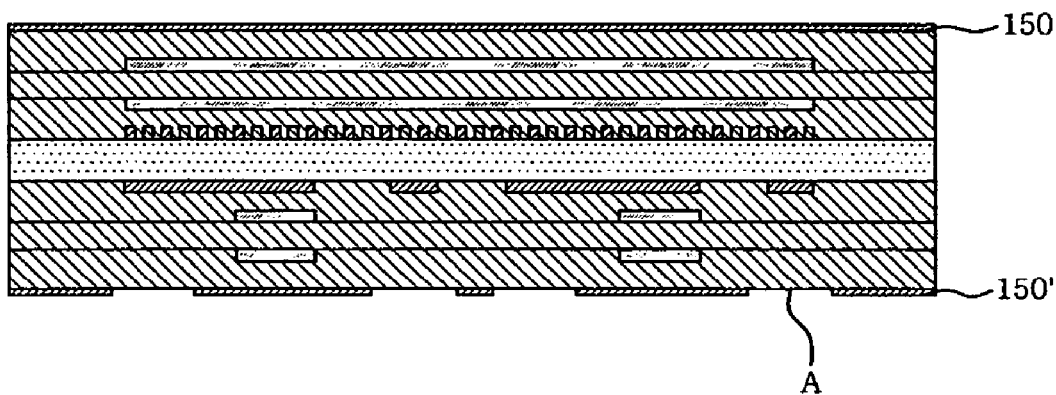
Figure 4M:
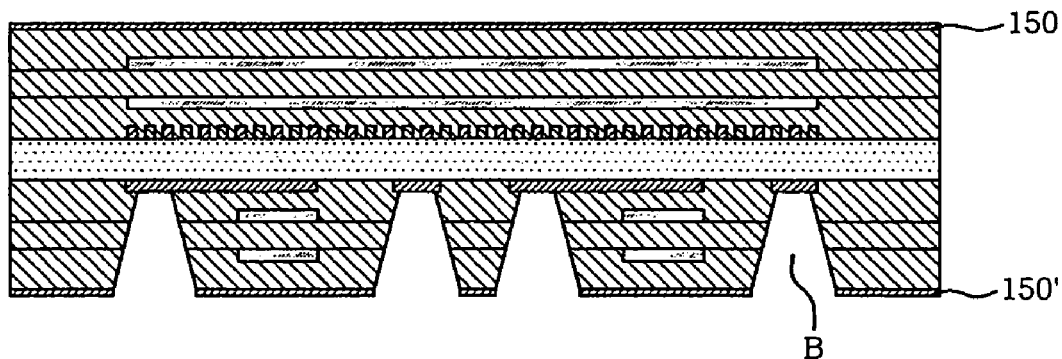
Figure 4N:
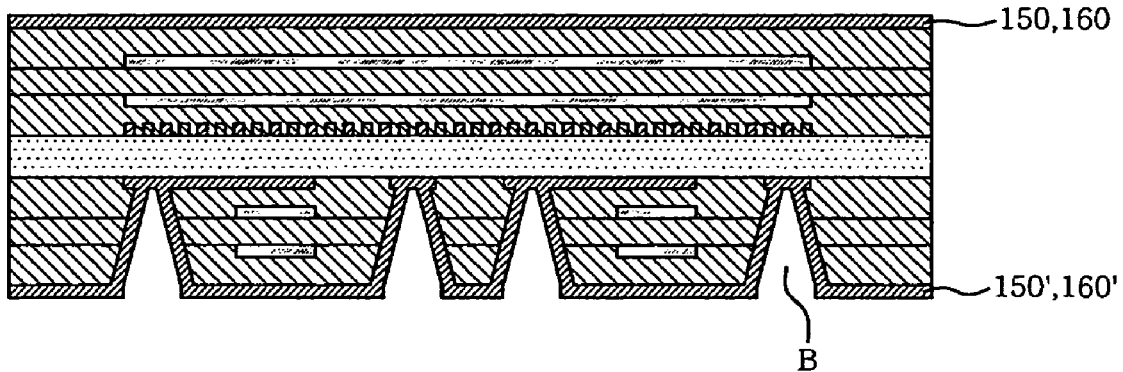
Figure 4O:
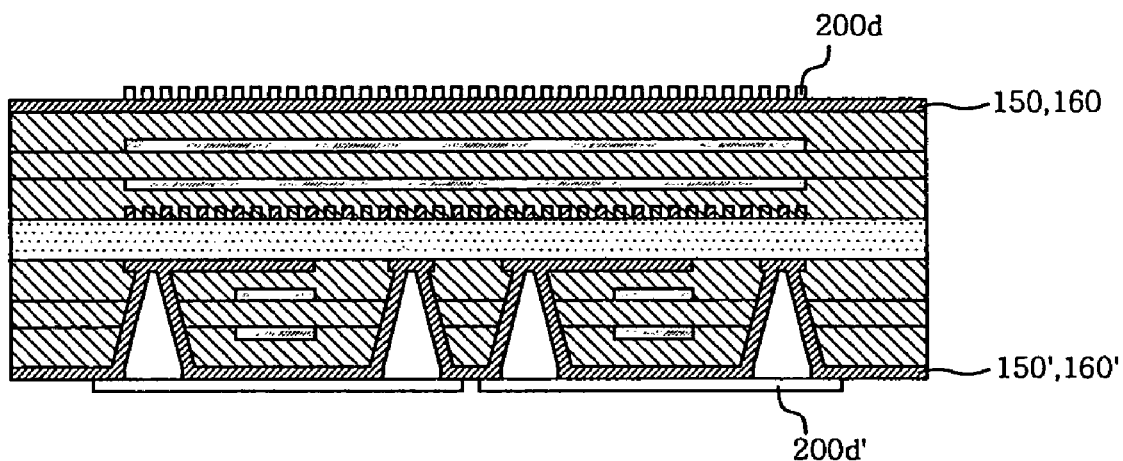
Figure 4P:
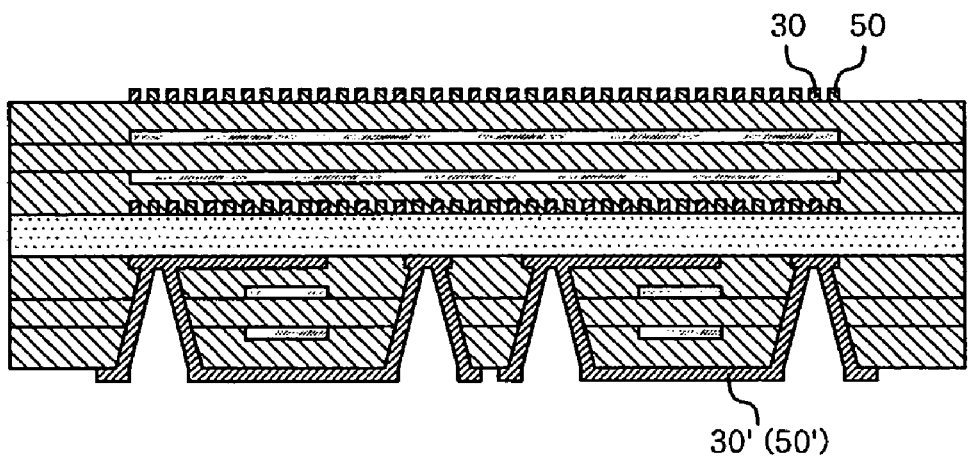
Figure 4Q:
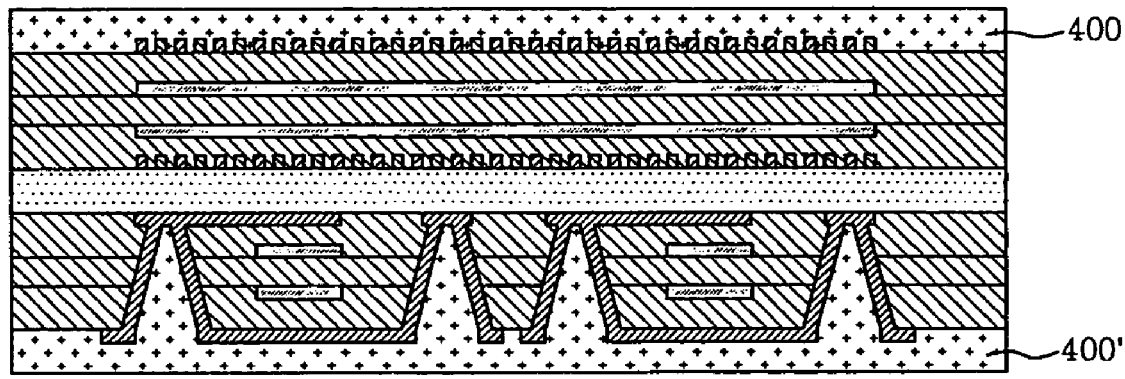

FIGS. 4a to 4q are cross sections taken along line X-X' of FIG. 3, which show the flow of a method of manufacturing the PCB having the weak magnetic field sensor.

As shown in FIG. 4a, a base plate, which is a copper clad laminate formed by coating an insulating resin layer 111 with copper foils 112 and 112', is prepared.

In this case, there are various types of copper clad laminates used as the base plate 110, such as a glass/epoxy copper clad laminate, a heat-resistant resin copper clad laminate, a paper/phenol copper clad laminate, a copper clad laminate for a high frequency, a flexible copper clad laminate, a composite copper clad laminate depending on use. However, the glass/epoxy copper clad laminate, in which an insulating resin layer 111 is laminated with copper foils 112 and 112', is preferably used in the manufacture of a double-sided PCB or multi-layered PCB.

As shown in FIG. 4b, dry films 200a and 200b are applied to the base plate 110, and are exposed and developed using art work films (not shown) on which certain patterns are printed, so that etching resist patterns including a first x-axial excitation circuit pattern and a first x-axial detection circuit pattern are formed on the upper dry film 200a of the base plate 110, and etching resist patterns including a first y-axial excitation circuit pattern and a first y-axial detection circuit patterns are formed on the lower dry film 200a' of the base plate 110.

In this case, each of the dry films 200a and 200a' are formed of three layers including a cover film, a photoresist film and a mylar film, and the photoresist film practically functions as a resist.

The exposure and development processes are performed in such a way that the art work films on which certain patterns are printed adhere close to the dry films 200a and 200a' and ultraviolet rays are irradiated thereon. In this case, the pattern-printed black portions of the art work films cannot transmit the ultraviolet rays, and the portions of the art work films on which patterns are not printed can transmit the ultraviolet rays, so that dry films 200a and 200a' located below the art work films are hardened. When the copper clad laminate, in which the dry films 200a and 200a' are hardened, is immersed in a developer, the portions of the dry films 200a and 200a', which are not hardened, are removed by the developer, and only the hardened portions of the dry films 200a and 200a' remain and form etching resistor patterns. In this case, the aqueous solution of carbon sodium $Na_2CO_3$ or carbon kalium $K_2CO_3$ is used as the developer.

As shown in FIG. 4c, the upper and lower copper foils 112 and 112' are etched using the dry films 200a and 200a' as etching resists, so that the first x-axial excitation circuit 20 and first detection circuit 40 are formed on the upper copper foil 112 of the base plate 110, and first y-axial excitation circuit 20' and first detection circuit 40' are formed on the lower copper foil 112' of the base plate 110. Thereafter, the dry films 200a and 200a' are removed using a stripper, such as sodium hydroxide NaOH or potassium hydroxide KOH.

Although the dry films 200a and 200a' are used as the etching resist in the processes of FIGS. 4b and 4c, liquid photoresist can be used as the etching resist. In this case, the liquid photoresist, which is exposed to ultraviolet rays, is applied to the base plate 110, and then dried. Thereafter, the photoresist is exposed and developed using the art work films on which certain patterns are formed, so that etching resist patterns including the first excitation circuit patterns and the first detection circuit patterns are formed on the photoresist. Thereafter, the upper and lower copper foils 112 and 112' are etched using the photoresist, on which the certain patterns are formed, as the etching resist, so that the first x-axial excitation circuit 20 and first detection circuit 40 are formed on the upper copper foil 112, and the first y-axial excitation circuit 20' and first detection circuit 40' are formed on the lower copper foil 112'. Thereafter, the photoresist is removed. In this case, a dip coating method, a roll coating method or an electro-deposition method can be used as a method of coating the liquid photoresist.

In the meantime, as shown in FIG. 4d, soft magnetic substances 311 and 312, which are the preforms of x-axial soft magnetic cores, are laminated on the top and bottom of an insulator 130 (e.g., prepreg).

In this case, since the final size of the PCB is larger if the thickness of the insulator 130 is larger, it is preferable that the thickness of the insulator 130 is 30 to 100 µm.

As shown in FIG. 4e, dry films 200b and 200b' are applied to the soft magnetic substances 311 and 312, and exposed and developed using art work films (not shown) on which certain patterns are printed, so that etching resist patterns including first and second x-axial soft magnetic core patterns are formed on the dry films 200b and 200b'.

As shown in FIG. 4f, the soft magnetic substances 311 and 312 are etched using the dry films 200b and 200b' as etching resists, so that first and second x-axial soft magnetic cores 11 and 12 are formed. Thereafter, the dry films 200b and 200b' are removed using a stripper, such as sodium hydroxide NaOH or potassium hydroxide KOH.

Similarly to the above-described processes of FIGS. 4b and 4c, the first and second x-axial soft magnetic cores 11 and 12 can be formed using the liquid photoresist as the etching resist in the processes of FIGS. 4e and 4f.

Although, in the present embodiment, two x-axial soft magnetic cores 11 and 12 are described, three or more soft magnetic cores can be formed. In this case, an insulator and the preform of a soft magnetic core are laminated on one side of the first and second x-axial soft magnetic cores 11 and 12. Thereafter, a dry film or liquid photoresist is applied to the preform of the soft magnetic core, and exposed and developed, so that etching resist patterns are formed. Thereafter, an x-axial third soft magnetic core is formed on the preform of the soft magnetic core using the etching resist patterns. Accordingly, a desired number of soft magnetic cores can be formed by repeating such a process. Using another method, third and fourth x-axial soft magnetic cores can be formed in such a way that insulators and the preforms of a soft magnetic core are laminated on both sides of the first and second x-axial soft magnetic cores 11 and 12.

Meanwhile, as shown in FIG. 4g, the soft magnetic substances 311' and 312', which are the preforms of y-axial soft magnetic cores, are laminated on the top and bottom side of the insulator 130'.

Like the insulator 130 of FIG. 4d, if the thickness of an insulator 130' is larger, the final size of the PCB is larger. Accordingly, the thickness of the insulator 130' is preferably 30 to 100 µm.

As shown in FIG. 4h, dry films 200c and 200c' are applied to soft magnetic substances 311' and 312', and exposed and developed using art work films (not shown) on which certain patterns are printed, so that etching resist patterns including first and second y-axial soft magnetic core patterns are formed on the dry films 200c and 200c'.

As shown in FIG. 4i, the soft magnetic substances 311' and 312' are etched using the dry films 200c and 200c' as etching resists, so that first and second y-axial soft magnetic cores 11' and 12' are formed. Thereafter, the dry films 200c and 200c' are removed using a stripper, such as sodium hydroxide NaOH or potassium hydroxide KOH.

Thereafter, like the x-axial soft magnetic cores, three or more y-axial soft magnetic cores can be formed.

Similar to the above-described processes of FIGS. 4b and 4c, the first and second y-axial soft magnetic cores 11' and 12' can be formed using the liquid photoresist as the etching resist in the processes of FIGS. 4h and 4i.

As shown in FIG. 4j, a preliminary layup of an upper copper foil 150, a second upper insulator 140, first and second x-axial soft magnetic cores 11 and 12, a first upper insulator 120, a base plate 110, a first lower insulator 120', first and second y-axial soft magnetic cores 11' and 12', a second lower insulator 140' and a lower copper foil 150', sequentially from the top, is performed.

In this case, prepreg is used as the first and second insulators 120, 120', 140 and 140'. Furthermore, since the final size of the PCB is large, the thicknesses of the insulators 120, 120', 140 and 140' are preferably 30 to 100 µm.

Furthermore, it is possible to use upper and lower copper foils 150 and 150' having a 12 to 35 µm thickness, but it is preferable to use upper and lower copper foils 150 and 150' having a 12 µm thickness.

As shown in FIG. 4k, the upper copper foil 150, the second upper insulator 140, the first and second x-axial soft magnetic cores 11 and 12, the first upper insulator 120, the base plate 110, the first lower insulator 120', the first and second y-axial soft magnetic cores 11' and 12', the second lower insulator 140 and the lower copper foil 150' are laminated by heating and pressuring at predetermined temperature and pressure (e.g., about 150 to 200° C. and 30 to 40 kg/cm$^2$)

As shown in FIG. 4l, the thicknesses of the upper and lower copper foils 150 and 150' are reduced through uniform etching, and exposure, development and etching processes using dry films (not shown) are performed to form windows A for forming via holes.

In this case, the thicknesses of the etched copper foils 150 and 150' are preferably 3 to 7 µm, and wet etching (e.g., etching using an etching solution) or dry etching (e.g., etching using plasma) can be used as an etching method.

As shown in FIG. 4m, using the windows A formed on the copper foils 150 and 150', upper via holes (not shown) are formed to be connected to the first x-axial excitation circuit 20 and detection circuit 40, and lower via holes B are formed to be connected to the first y-axial excitation circuit 20' and detection circuit 40'.

In this case, a process of forming the upper and lower via holes is preferably performed in such a way that the upper and lower insulators 120, 120', 130, 130', 140 and 140' are processed using a laser drill. A carbon dioxide laser drill is preferably used as the laser drill. In the case where the via holes B are formed using a Yttrium Aluminum Garnet (YAG) laser drill capable of processing the copper foils 150 and 150', the via holes B can be formed on the copper foils 150 and 150' without a process of forming the windows A.

In an embodiment, after forming the via holes B, it is preferable to perform a desmear process of removing smears that are generated on the sidewalls of the via holes B because heat generated at the time of forming via holes B melts the insulators 120, 120', 130, 130', 140 and 140'.

In another embodiment, in the case of forming through holes for connecting the upper copper foil 150 to the lower copper foil 150', a mechanical drill, such as a Computer Numerical Control (CNC) drill, other than the laser drill can be used.

As shown in FIG. 4n, in order to electrically connect the first excitation circuits 20 and 20' and first detection circuits 40 and 40' to the copper foils 150 and 150', copper plated layers 160 and 160' are formed on the sidewalls of the via holes B and the copper foils 150 and 150'.

In this case, the sidewalls of the via holes B are insulators 120, 120', 130, 130', 140 and 140', so that an electrolytic copper plating process cannot be performed immediately after the via holes B are formed.

Accordingly, an electroless copper plating process is performed first to electrically connect the formed via holes and perform the electrolytic copper plating process. The electroless copper plating process is performed on the insulators 120, 120', 130, 130', 140 and 140', so that it is difficult to expect reaction to ions having electricity. Such an electroless copper plating process is performed by a deposit reaction, and the deposition reaction is accelerated by a catalyst. In order to deposit copper from the plating solution, the catalyst must be attached to the surface of a material to be plated. This imports that the electroless copper plating process requires a lot of pre-processes.

In an embodiment, the electroless copper plating process includes a cleanet step, a soft etching step, a pre-catalyst step, a catalyst step, an accelerator step, an electroless copper plating step and an oxidation protection step.

In the cleanet step, oxide or impurities, particularly oil and fat, existing on the surfaces of the upper and lower copper foils 150 and 150' are removed using a chemical including an acid or alkali surface active agent, and the surface active agent is completely washed.

In the soft etching step, minute roughness (e.g., about 1 to 2 µm) is given to the surfaces of the upper and lower copper foils 150 and 150', so that copper particles can be uniformly attached to the surfaces in the plating process, and contaminants that were not processed in the cleaning process are removed.

In the pre-catalyst step, by immersing the PCB in a low concentration catalytic chemical, chemicals used in the catalyst step are prevented from being contaminated or the concentration of the chemicals from being changed. Additionally, since the PCB is previously immersed in the same chemical tub, the catalyst processing is more activated. Such a pre-catalyst step uses a catalyst chemical that is preferably diluted to 1 to 3%.

In the catalyst step, catalyst particles are applied to the surfaces of the copper foils 150 and 150' and the insulators 120, 120', 130, 130', 140 and 140' (i.e., the sidewalls of the via holes B). It is preferable to use Pd—Sn compound as the catalyst particles, and the Pd—Sn compound in which $Cu^{2+}$ and $Pd^{2-}$ that are particles to be plated are combined together functions to accelerate the plating.

In the electroless copper plating step, the plating solution is preferably composed of $CuSO_4$, HCHO, NaOH and other stabilizers. In order to maintain a plating reaction, a chemical reaction must be balanced, and it is important to control the composition of the plating solution for the balancing of the chemical reaction. In order to maintain the composition, the proper supply of insufficient components, a mechanical stirring, and a system for circulating a plating solution must be appropriately operated. Furthermore, a filter device is required to filter out by-products generated as a result of the reaction, and the time of use of the plating solution can be extended using the filter device.

In the oxidation protection step, oxidation protection films are coated on all surfaces to protect plating films from being oxidized due to the alkali components remaining after the electroless copper plating step.

However, the physical characteristics of the above-described electroless copper plating step are generally deteriorated compared to those of the electrolytic copper plating step, so that copper plating is formed to be thin.

After the electroless copper plating process is completed, the PCB is immersed in the copper plating solution contained in a tub, and electrolytic copper plating is performed using a Direct Current (DC) rectifier. The electrolytic copper plating process preferably uses a method of calculating an area to be plated, applying a proper current to the DC rectifier and depositing copper. The electrolytic copper plating process is advantageous in that the physical characteristics of a copper plated layer are superior to those of the electroless copper plated layer, and it is easy to form a thick copper plated layer.

The thicknesses of the copper plated layers 160 and 160' formed as described above are preferably 15 to 18 μm.

As shown in FIG. 4o, dry films 200d and 200d' are applied to the upper and lower copper foils 150 and 150' and the copper plated layers 160 and 160', and exposed and developed using art work films (not shown) on which certain patterns are printed, so that etching resist patterns including second x-axial excitation circuit patterns and second x-axial detection circuit patterns are formed on the upper dry film 200d, and etching resist patterns including second y-axial excitation circuit patterns and second y-axial detection circuit patterns are formed on the lower dry film 200d'.

As shown in FIG. 4p, the upper and lower copper foils 150 and 150' and the copper plated layers 160 and 160' are etched using the upper and lower dry films 200d and 200d' as etching resists, so that a second x-axial excitation circuit 30 and a second x-axial detection circuit 50 are formed on the upper copper foil 150 and the copper plated layer 160, and a second y-axial excitation circuit 30' and second y-axial detection circuit 50' are formed on the bottom copper foil 150' and copper plated layer 160'. Thereafter, the dry films 200d and 200d' are removed using a stripper, such as sodium hydroxide NaOH or potassium hydroxide KOH.

Similar to the above-described processes of FIGS. 4b and 4c, the second x-axial excitation circuit 30, the second x-axial detection circuit 50, the second y-axial excitation circuit 30' and the second y-axial detection circuit 50' can be formed using the liquid photoresist as the etching resist in the processes of FIGS. 4o and 4p.

As shown in FIG. 4q, solder resists 400 and 400' are applied and hardened.

In this case, if finger prints, oil or dusts adhere to the PCB on which the second excitation circuits 30 and 30' and the second detection circuits 50 and 50' are formed on the copper foils 150 and 150' and the copper plated layers 160 and 160', a problem may arise in that the solder resists 400 and 400', which will be formed in the next process, and the PCB does not completely adhere to each other. Accordingly, it is preferable that a pre-processing, in which the surfaces of the substrate are washed and minute roughness is given to the surfaces of the substrate, is preferably performed before the solder resists 400 and 400' are applied.

Methods of applying the solder resists 400 and 400' include a screen printing method, a roller coating method, a curtain coating method and a spray coating method can be used.

Thereafter, when a process of forming the outer block of the PCB is performed using a surface processing process, such as nickel/gold plating, and a router or power press, the PCB having the weak magnetic field sensor according to the present invention is manufactured.

The sensibility S of the weak magnetic field sensor of the present invention manufactured according to the above-described method can be expressed by Equation 1, $$S = \alpha \times N \times A \times \mu \times f \quad (1)$$

where α is a coefficient related to an equilibrium state and an declining part on a B (magnetic flux density)–H (internal magnetic field) curve of the soft magnetic core, N is the number of turns of the excitation circuit or detection circuit wound around a soft magnetic core, A is the sectional area of the soft magnetic core, μ is the magnetic permeability of the soft magnetic core, and f is a frequency at which the soft magnetic core is excited.

As known from Equation 1, the sensibility S of the weak magnetic field sensor increases as the sectional area A of the soft magnetic core increases. Accordingly, since the sectional area of the weak magnetic field sensor of the present invention increases according to an increase in the number of soft magnetic cores 11, 12, 11' and 12', the sensitivity increases. Even though the number of turns of the excitation circuits 20, 30, 20' and 30' or detection circuit 40, 50, 40' and 50' wound around the soft magnetic cores 11, 12, 11' and 12' is reduced, the weak magnetic field sensor having excellent sensitivity can be obtained in the case where α, μ and f do not change.

Figure 5A:
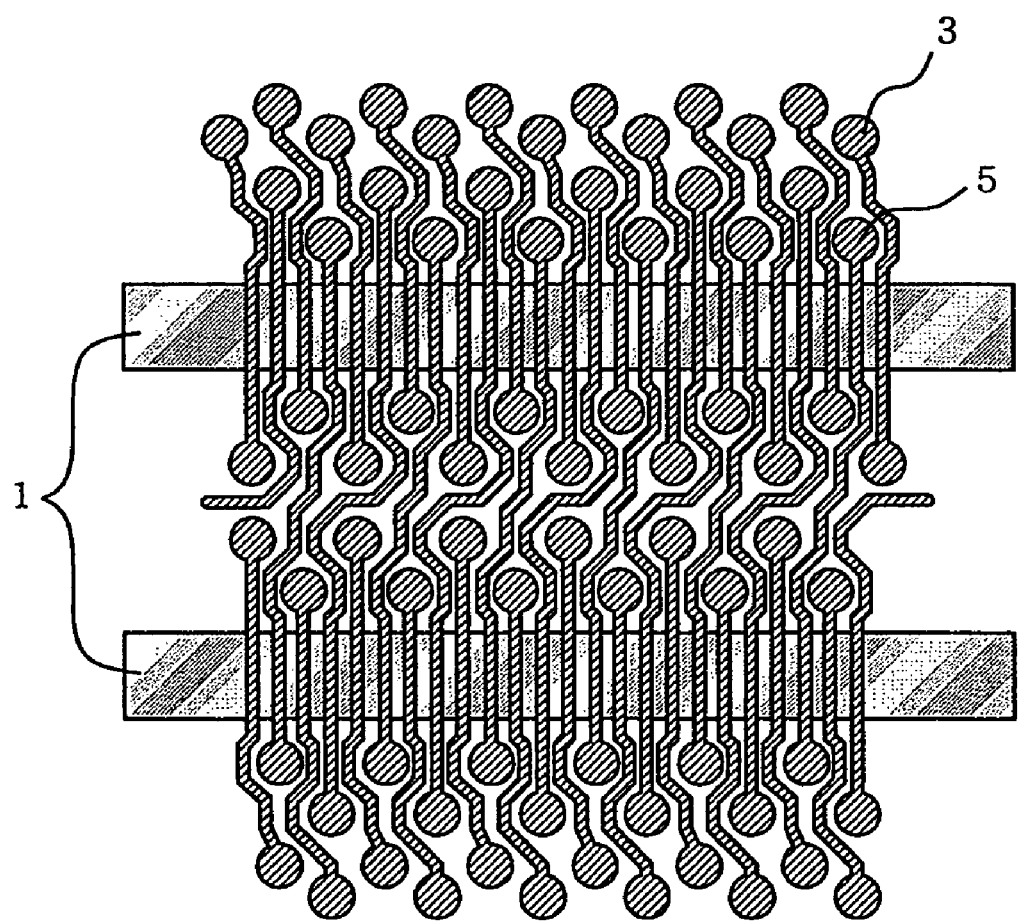
FIG. 5a is a see-through plan view showing the PCB having the conventional weak magnetic field sensor.

FIG. 5a is a see-through plan view showing a PCB having a weak magnetic field sensor manufactured according to Korean Pat. No. 432,622 filed on Mar. 9, 2002 by the present applicant, which shows a first layer on which second x-axial driving patterns 3 (corresponding to the second excitation circuit of the present invention) and second x-axial pickup patterns 5 are formed, and a second layer on which two rod-shaped x-axial magnetic substances 1 (corresponding to the x-axial soft magnetic cores of the present invention) are formed. Additionally, FIG. 5b is a see-through plan view showing the PCB having the weak magnetic field sensor manufactured according to the present invention, which shows a first layer on which a second x-axial excitation circuit 30a and a second x-axial detection circuit 50a are formed, and a second layer on which two rod-shaped x-axial soft magnetic cores 12a are formed.

As shown in FIG. 5a, the conventional weak magnetic field sensor is formed in such a way that the driving patterns 3 and the pickup patterns 5 are wound twelve times around the magnetic substance 1.

Figure 5B:
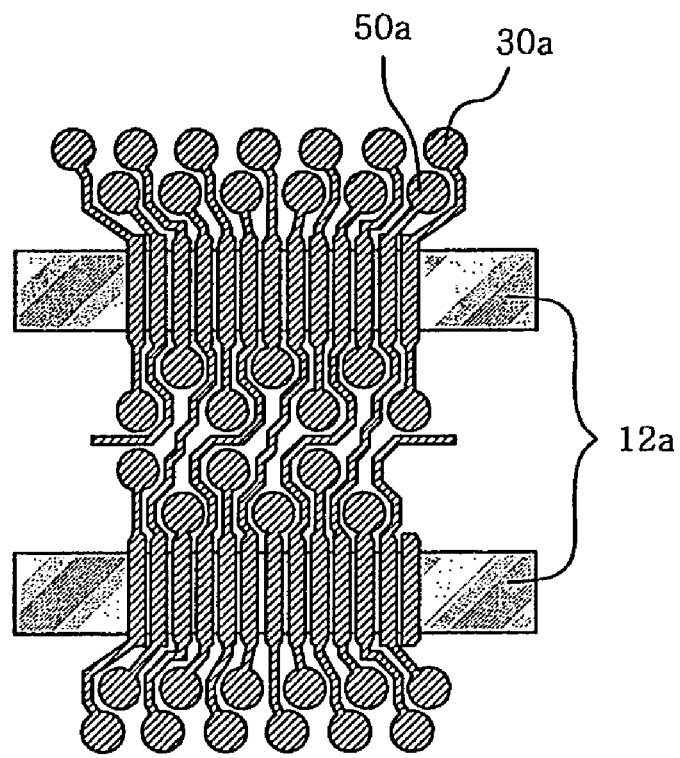
FIG. 5b is a see-through plan view showing the PCB having the weak magnetic field sensor according to an embodiment of the present invention.

In contrast, as shown in FIG. 5b, the weak magnetic field sensor of the present invention is formed in such a way that the excitation circuit 30a and the detection circuit 50a are wound six times around the soft magnetic cores 12a to obtain the same sensibility.

Furthermore, in the conventional weak magnetic field sensor, the lands of via holes formed outside the two magnetic substances 1 are arranged in four rows to form driving patterns 3 and pickup patterns 5 on the first layer twelve times. Accordingly, the size of the conventional weak magnetic field sensor is determined according to the total size of the driving and pickup patterns 3 and 5.

In contrast, in the weak magnetic field sensor of the present invention, the lands of via holes formed on the outside of the two soft magnetic cores 12a are arranged in two rows to form the excitation circuit 30a and detection circuit 50a on the first layer six times. The reason for this is that, if the number of turns of the excitation circuit 30a and detection circuit 50a is reduced, the excitation circuit 30a and the detection circuit 50a, which are connected to the land parts of the via holes from the soft magnetic cores 12a, can be formed in a slant direction, so that the spaces of the land parts of the via holes are widened so as to be arranged in two rows. Accordingly, the size of the weak magnetic field sensor according to the present invention is determined by the locations of the lands of the via holes.

In an embodiment, while the size of the PCB having the conventional weak magnetic field sensor is 5.3 mm×5.3 mm=28.09 mm², the size of the PCB having the weak magnetic field sensor of the present invention is 4.0 mm×4.0 mm=16.0 mm² (about 57% of the size of the conventional weak magnetic field sensor), but their sensitivity is the same.

Figure 5C:
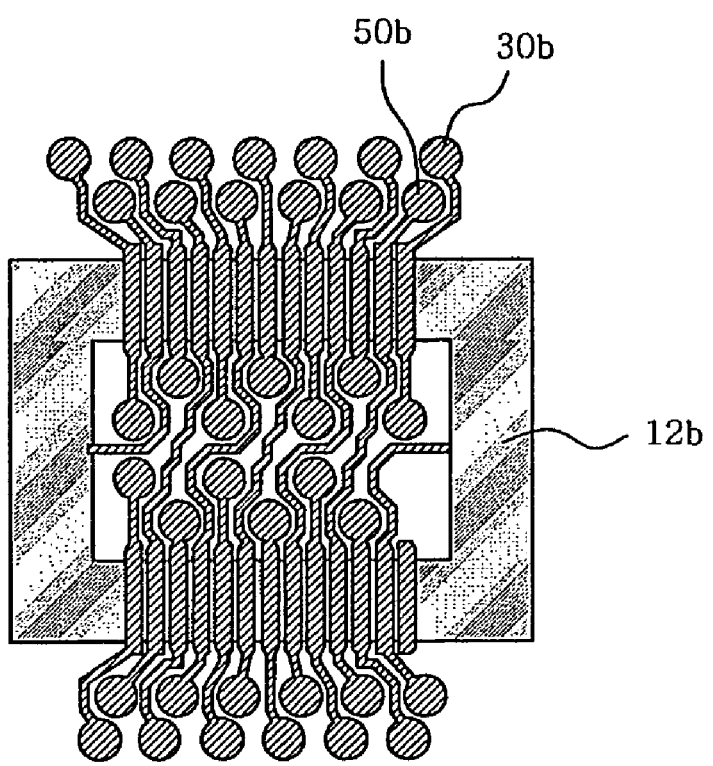
FIG. 5c is a see-through plan view showing the PCB having the weak magnetic field sensor according to another embodiment of the present invention.

FIG. 5c is a see-through plan view showing a PCB having a weak magnetic field sensor according to another embodiment of the present invention, which shows a first layer on which a second x-axial excitation circuit 30b and a second x-axial detection circuit 50b are formed, and a second layer on which a rectangular ring-shaped x-axial soft magnetic core 12b is formed.

When the PCB having the weak magnetic field sensor of FIG. 5b is compared with the PCB having the weak magnetic field sensor of FIG. 5b, there is a difference in that the weak magnetic field sensor of FIG. 5b uses two pairs of rectangular shaped soft magnetic cores 12a, while the weak magnetic field sensor of FIG. 5c uses a pair of rectangular ring-shaped soft magnetic cores 12b.

Although, in this embodiment, two pairs of rectangular shaped soft magnetic cores or a pair of rectangular ring-shaped soft magnetic cores are used, soft magnetic cores having the same or a similar shape can be used according to a purpose or use.

Furthermore, although, in this embodiment, two pairs of soft magnetic cores (or two soft magnetic cores), around which one-axial (e.g., x-axial or y-axial) excitation circuit and detection circuit are wound, are used, three or more pairs of soft magnetic cores (or three soft magnetic cores) may be used to enhance integrity.

As described above, the present invention provides a PCB having a high-sensitive weak magnetic field sensor, in which the sectional area of a soft magnetic core is increased so that a weak magnetic field, such as the geomagnetic field, can be accurately detected, and a method of manufacturing the same.

Accordingly, the PCB having the weak magnetic field sensor and the method of manufacturing the same according to the present invention are effective in that the weak magnetic field can be detected with excellent sensitivity even though the number of turns of the excitation circuit and the detection circuit is reduced, because the sectional area of the soft magnetic core is increased.

Furthermore, the PCB having the weak magnetic field sensor and the method of manufacturing the same according to the present invention are effective in that it can provide a subminiature and high-integrated weak magnetic field sensor because it provides excellent sensitivity even though the number of turns of the excitation circuit and the detection circuit is reduced.

Furthermore, the PCB having the weak magnetic field sensor and the method of manufacturing the same according to the present invention are effective in that it can cope with miniaturized, lightweight, highly integrated and multi-functional electronic products because it provides the subminiature weak magnetic field sensor.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A Printed Circuit Board (PCB) having a weak magnetic field sensor, comprising:
   a base plate with a first side and a second side, each side being formed with a first excitation circuit and a first detection circuit;
   first and second soft magnetic core bodies laminated on said first side and said second side, respectively, each magnetic core body being formed of a plurality of soft magnetic cores; and
   first and second outer layers laminated on said first and second soft magnetic core bodies, respectively, each of said first and second outer layers having a second excitation circuit and a second detection circuit, each second excitation and detection circuit being connected to a respective first excitation circuit and first detection circuit on said base, to surround the first and second soft magnetic cores, respectively;
   wherein the soft magnetic cores, the excitation circuits and the detection circuits formed on the first side of the base plate, and the soft magnetic cores, the excitation circuits and the detection circuits formed on the second side of the base plate are perpendicular to each other, respectively.

2. The PCB as set forth in claim 1, wherein the soft magnetic cores are made of material selected from the group consisting of amorphous metal, permalloy and supermalloy.

3. The PCB as set forth in claim 1, wherein the first excitation circuit and the first detection circuit are alternately formed, and the second excitation circuit and the second detection circuit are alternately formed.

4. The PCB as set forth in claim 1, wherein the plurality of soft magnetic cores form rods whose number is a multiple of two, and the excitation circuits and the detection circuits are perpendicular to the plurality of soft magnetic cores.

5. The PCB as set forth in claim 1, wherein:
   the plurality of soft magnetic cores has rectangular ring shapes;
   the excitation circuit and detection circuit formed on a first side of the base plate are perpendicular to sides of the soft magnetic cores; and
   the excitation circuit and detection circuit formed on a second side of the base plate are parallel with the sides of the soft magnetic cores.

* * * * *